(12) United States Patent
Funk et al.

(10) Patent No.: US 11,393,663 B2
(45) Date of Patent: Jul. 19, 2022

(54) METHODS AND SYSTEMS FOR FOCUS RING THICKNESS DETERMINATIONS AND FEEDBACK CONTROL

(71) Applicant: Tokyo Electron Limited, Tokyo (JP)

(72) Inventors: Merritt Funk, Austin, TX (US); Alok Ranjan, Austin, TX (US); Barton Lane, Austin, TX (US); Peter Ventzek, Austin, TX (US); Justin Moses, Austin, TX (US); Chelsea DuBose, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/405,244

(22) Filed: May 7, 2019

(65) Prior Publication Data

US 2020/0273678 A1 Aug. 27, 2020

Related U.S. Application Data

(60) Provisional application No. 62/810,069, filed on Feb. 25, 2019.

(51) Int. Cl.
*H01J 37/32* (2006.01)
*H01L 21/67* (2006.01)
*G05B 19/418* (2006.01)

(52) U.S. Cl.
CPC .. *H01J 37/32642* (2013.01); *G05B 19/41875* (2013.01); *H01J 37/32082* (2013.01);
(Continued)

(58) Field of Classification Search
CPC .......... H01J 37/32642; H01J 37/32082; H01J 2237/3323; H01J 2237/3343;
(Continued)

(56) References Cited

U.S. PATENT DOCUMENTS

2005/0151544 A1* 7/2005 Mahoney .......... H01J 37/32935
324/655
2009/0026170 A1* 1/2009 Tanaka .............. H01J 37/32091
216/60
(Continued)

FOREIGN PATENT DOCUMENTS

CN 101847558 A * 9/2010 ........ H01J 37/32091
KR 20120024686 A * 3/2012 ............. C03C 12/00

OTHER PUBLICATIONS

International Search Report dated Jun. 4, 2020 in corresponding International Application No. PCT/US2020/016744.
(Continued)

*Primary Examiner* — Chad G Erdman
(74) *Attorney, Agent, or Firm* — Oblon, McClelland, Maier & Neustadt, L.L.P.

(57) ABSTRACT

Methods and systems are disclosed for focus ring thickness measurement and feedback control within process chambers. For disclosed embodiments, in-chamber sensors measure physical parameters associated with focus rings, and these measurements are used to determine thickness for the focus rings. The thickness determinations can be used to detect when a focus ring should be replaced and can also be used as feedback to adjust the position of the focus rings within the chamber. For one embodiment, measurements from ultrasonic sensors are used to make thickness determinations for focus rings. For further embodiments, these ultrasonic sensors are positioned at end portions of focus ring lift pins. Other sensors can also be used such as capacitive sensors, resistive sensors, and/or other desired sensors. Further variations and implementations can also be achieved using in-chambers sensors to facilitate focus ring thickness determinations.

24 Claims, 8 Drawing Sheets

(52) U.S. Cl.
CPC ........... *H01L 21/67276* (2013.01); *G05B 2219/31103* (2013.01); *G05B 2219/45031* (2013.01); *H01J 2237/3323* (2013.01); *H01J 2237/3343* (2013.01)

(58) Field of Classification Search
CPC .... G05B 19/41875; G05B 2219/31103; G05B 2219/45031; H01L 21/67276
See application file for complete search history.

(56) References Cited

U.S. PATENT DOCUMENTS

| | | | | |
|---|---|---|---|---|
| 2010/0134122 | A1* | 6/2010 | Furumura | H01L 21/67248 324/655 |
| 2012/0058630 | A1* | 3/2012 | Quinn | C23C 16/52 438/483 |
| 2012/0249986 | A1* | 10/2012 | Tanaka | H01J 37/32642 355/55 |
| 2016/0141154 | A1* | 5/2016 | Kamata | H01J 37/32642 324/671 |
| 2017/0301578 | A1* | 10/2017 | Hong | H01J 37/3244 |
| 2018/0061696 | A1* | 3/2018 | D'Ambra | H01J 37/32642 |
| 2018/0261481 | A1* | 9/2018 | Eto | G01K 11/3213 |
| 2018/0315640 | A1* | 11/2018 | Ueda | H01J 37/32642 |
| 2019/0013232 | A1* | 1/2019 | Yan | H01J 37/32715 |
| 2019/0385880 | A1* | 12/2019 | Myles | H01L 21/68 |

OTHER PUBLICATIONS

International Preliminary Report on Patentability and Written Opinion dated Sep. 2, 2021 in PCT/US2020/016744, 7 pages.

* cited by examiner

METHODS AND SYSTEMS FOR FOCUS RING THICKNESS DETERMINATIONS AND FEEDBACK CONTROL

RELATED APPLICATIONS

This application claims priority to the following provisional application: U.S. Provisional Patent Application Ser. No. 62/810,069, filed Feb. 25, 2019 and entitled "METHODS AND SYSTEMS FOR FOCUS RING," which is hereby incorporated by reference in its entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes. Process chambers and related etch and deposition processes are used to achieve these reduced features sizes.

For process chambers, focus rings (FRs) are often used to surround microelectronic workpieces, such as semiconductor wafers, that are being processed within the process chambers. Focus rings facilitate control and uniformity of etch and deposition processes within the process chamber. Over time, the focus ring (FR) can deteriorate leading to undesired variations in process uniformity within a particular process chamber or across different process chambers. Predictive models for this deterioration based upon manufacture information for focus rings are not effective because rates of deterioration for focus rings vary with different etch chemistries and within different process chambers.

SUMMARY

Methods and systems are described herein for focus ring thickness measurement and feedback control within process chambers. For disclosed embodiments, in-chamber sensors measure physical parameters associated with focus rings, and these measurements are used to determine thickness for the focus rings. The thickness determinations can be used to detect when a focus ring should be replaced and can also be used as feedback to adjust the position of the focus rings within the chamber. Different or additional features, variations, and embodiments can also be implemented, and related systems and methods can be utilized as well.

For one embodiment, a processing system is disclosed including a process chamber including a substrate holder, a focus ring positioned to surround a microelectronic workpiece when positioned on the substrate holder, one or more sensors within the process chamber where the one or more sensors generate measurements associated with the focus ring, and a controller coupled to adjust one or more parameters for the processing system based upon thickness determinations for the focus ring based upon the measurements.

In additional embodiments, the thickness determinations are based upon a model relating the measurements to focus ring thickness.

In additional embodiments, the one or more sensors are configured to provide ultrasonic measurements associated with the focus ring. In further embodiments, the processing system also includes one or more transmitters positioned to transmit ultrasonic pulses to the focus ring and one or more receivers configured to receive return pulses associated with surfaces of the focus ring, and the thickness determinations are based upon time differences between the return pulses. In still further embodiments, the controller is further configured to determine a thickness for a plasma sheath formed above the microelectronic workpiece within the process chamber based upon return pulses.

In additional embodiments, the one or more sensors include at least one of a continuous ring positioned under the focus ring or a plurality of ring segments positioned under the focus ring. In further embodiments, the one or more sensors are configured to provide resistive measurements associated with the focus ring. In still further embodiments, the one or more sensors are configured to provide capacitive measurements associated with the focus ring based upon signals applied to the focus ring.

In additional embodiments, the processing system also includes one or more lift pins configured to adjust a position of the focus ring within the process chamber. In further embodiments, the controller is configured to automatically adjust the position of the focus ring using the one or more lift pins based upon the thickness determinations. In still further embodiments, the one or more sensors are positioned within end portions for the one or more lift pins.

In additional embodiments, the controller is configured to calibrate the thickness determinations based upon known initial conditions for at least one material layer within the process chamber.

For one embodiments, a method for a processing system is disclosed including providing a process chamber having a focus ring positioned to surround a microelectronic workpiece when positioned on a substrate holder, generating measurements associated with the focus ring using one or more sensors, determining a thickness for the focus ring based upon the measurements, and adjusting one or more parameters for the processing system based upon thickness determinations for the focus ring.

In additional embodiments, the determining includes applying a model relating the measurements to focus ring thickness. In further embodiments, the adjusting includes replacing the focus ring based upon the thickness determinations.

In additional embodiments, the generating includes using the one or more sensors to generate ultrasonic measurements associated with the focus ring. In further embodiments, the method also includes transmitting ultrasonic pulses to the focus ring and measuring return pulses associated with surfaces of the focus ring, and the determining is based upon time differences between the return pulses.

In additional embodiments, the providing, generating, and determining are performed for a plurality of process chambers, and the adjusting is performed to match process parameters across the plurality of process chambers. In further embodiments, the generating includes using the one or more sensors to generate resistive measurements associated with the focus ring. In still further embodiments, the generating includes applying excitation signals to the focus ring and using the one or more sensors to generate capacitive measurements associated with the focus ring.

In additional embodiments, the method also includes adjusting a position of the focus ring within the process chamber using one or more lift pins. In further embodiments, the method also includes automatically adjusting the position of the focus ring using the one or more lift pins based upon the determining. In still further embodiments, the one or more sensors are embedded within the one or more lift pins.

In additional embodiments, the method also includes calibrating the determining based upon known initial conditions for at least one material layer within the process chamber.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Methods and systems are described herein for focus ring thickness measurement and feedback control within process chambers. Thickness for the focus rings are determined within process chambers, and adjustments are made based upon the thickness determinations. The disclosed embodiments provide accurate tracking of focus ring deterioration, and appropriate adjustments can then be made to extend time between service events for process chambers due to deteriorated focus rings. Adjustments include determinations for when a focus ring should be replaced, automatic adjustment to the position or height of a focus ring within a process chamber, adjustments to process parameters for the process chamber, adjustments due to focus ring thickness variations across different process chambers to match process parameters across the different process chambers, and/or other adjustments. For example, lot-to-lot detection of focus ring thickness can be used to adjust the focus ring height and thereby provide improved process control and factory level process monitoring. Other advantages and implementations can also be achieved while still taking advantage of the process techniques described herein.

For one embodiment, measurements are provided using sensors included within the process chamber, and these measurements are used to determine the thickness for a focus ring within the process chamber. Adjustments can then be made to the focus ring or other process parameters based upon these thickness determinations. For example, adjustments can be made after a selected number of process cycles, can be made for each microelectronic workpiece (e.g., semiconductor wafer) being processed within the process chamber, or can be made based upon other criteria. For one embodiment, sensors are positioned under the focus ring, and these sensors are used to make measurements for thickness determinations for the focus rings. As direct measurements are made by the sensors within the process chamber, predictive erosion models for different process chemistries are not required, and the disclosed techniques are applicable to a wide range of focus ring materials. These focus ring materials can be, for example, quartz, doped silicon, undoped silicon, other materials, or combinations of materials. Further, lift pins for focus rings can also be included within the process chamber, and feedback based upon the focus ring thickness determinations can be used to adjust height for focus rings automatically. This feedback control, for example, can adjust for erosion or wear of the focus ring as different processes are used within the process chamber to process one or more different microelectronic workpieces. Other variations can also be implemented while still taking advantage of the thickness determination techniques described herein.

For one embodiment, the sensors are embedded sensors that measure physical parameters representing the remaining thickness for focus rings. These embedded sensors are preferably non-contact sensors. For example, passive or active circuits can be embedded in materials positioned under the focus ring. These passive or active circuits can be used to measure physical parameters for the focus rings that are used to determine the remaining thickness for the focus ring. The thickness determinations can be performed between process cycles, for example, between wafers being processed within the chamber.

Thickness determinations for focus rings can be performed using ultrasonic measurement techniques, capacitive measurement techniques, resistive measurement techniques, and/or other desired techniques using sensors positioned proximate a focus ring within a process chamber. For process chambers providing plasma processing, the measurement methods and systems described herein can be performed with the plasma "on" or "off" within the process chamber. Two point or single point measurement methods can be used to measure effective electrical circuit changes caused by changes in the thickness of the focus ring from an initial calibrated thickness.

With respect to ultrasonic measurement techniques, one or more of the following features and techniques can be implemented:
- measurement range from 0.1 millimeters (mm) to 100's of mm;
- signal frequencies from 0.5 megahertz (MHz) to 500 MHz;
- thickness compensation/calibration;
- measurement of quartz, ceramic, un-doped and doped silicon, metals, chamber walls;
- one example, measurement uses square wave at 30 MHz;
- single probe tip or dual probe tip;
- for one embodiment, signal generation method can be piezo-ceramic elements vibrating for example less than 100 kilohertz (kHz); or
- other features and techniques.

It is noted that for embodiments with piezo-ceramic elements that resonate with energy, the resonance of the surface, such as the focus ring, to which the element is attached or coupled will change with changes in thickness. For ultrasonic measurement techniques, the focus ring has energy-transmitting elements mounted to a substrate holder, in the focus ring, on the tip of a focus ring lift pin, or in another location relative to the focus ring. The driving energy from the transmitting elements will propagate from the edge of the transmitting elements, which can be protected by an intervening dielectric material to protect the transmitting elements from plasma within the process chamber. Reflected resonance or ultrasonic signals associated with the focus ring are measured by one or more pickup circuits. The pickup circuits can be inside the process chamber, outside the chamber, or both. Thickness determinations are then based upon changes in resonance frequency or return signals measured by the pickup circuits.

With respect to capacitive measurement techniques, one or more of the following features and techniques can be implemented:
- measurement range from 0.01 mm to 10 mm;
- low frequency measurement signals from 10 hertz (Hz) to 15 kHz;
- single or dual connection for sensors; or
- other features and techniques.

With respect to resistive measurement techniques, one or more of the following features and techniques can be implemented:
- used for doped wafers or semiconductor focus ring materials;
- measuring between two points using DC (direct current) to MHz signals;
- comparing conductivity and changes in conductivity to make thickness determinations; or
- other features and techniques.

Figure 1:
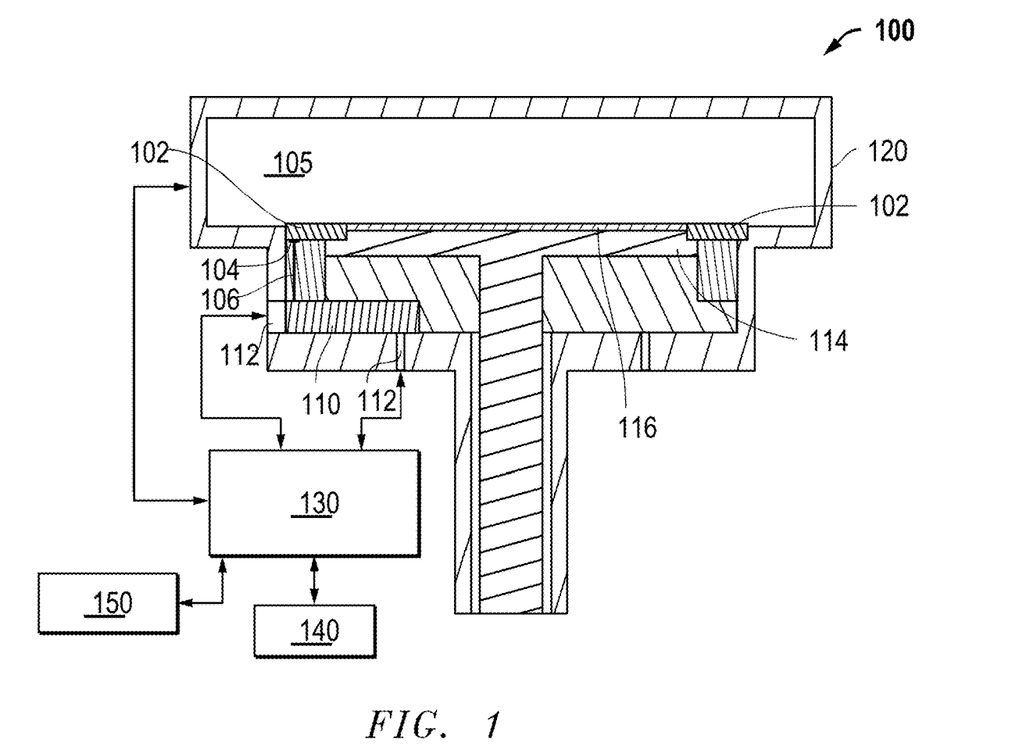
FIG. 1 is a cross-section diagram of an example embodiment for a processing system where one or more sensors are used in a process chamber to make thickness determinations for a focus ring within the process chamber.

FIG. 1 is a cross-section diagram of an example embodiment for a processing system 100 where one or more sensors 104 are used in a process chamber 120 to make thickness determinations for a focus ring (FR) 102 within the process chamber 120. The focus ring 102 is positioned adjacent and around the microelectronic workpiece 116, which can be a semiconductor wafer or other material. The process chamber 120 also includes a substrate holder 114, such as an electrostatic chuck, that supports the microelectronic workpiece 116. Process chemistries are injected into the processing region 105 and used to etch material layers from and/or deposit layers on the microelectronic workpiece 116. For example, plasma gas chemistries can be injected into the processing region 105 and ignited to generate plasma that assists etch and/or deposition processes.

For the example embodiment shown in FIG. 1, the sensor 104 is positioned under the focus ring 102 and a connection wire 106 extends to electronics 110 for the sensor 104. The sensor 104 can be an ultrasonic sensor, a capacitive sensor, a resistive sensor, or other measurement sensors. Further, one or more sensors 104 may be included to facilitate measurement of thickness for the focus ring 102. The sensor electronics 110 are shown as positioned below the substrate holder 114 but could be positioned one or more other locations as well. One or more communication paths 112 are located to provide external communication access to the sensor electronics 110. The communication paths 112 can be, for example, optical ports or windows, radio frequency (RF) ports or window, and/or other communication paths that allow external communications to the sensor electronics 110. As described herein, the sensor 104 is used to measure physical parameters of the focus ring 102 so that FR thickness can be determined. Variations can also be implemented.

For one embodiment, a controller 130 is coupled to the sensors 104 through electronics 110 and is coupled to the process chamber 120 to control adjustments to process parameters or components for the process chamber 120 as described herein. The controller 130 is also coupled to a memory 140. The controller 130 may be any suitable programmable integrated circuit. For example, the controller can be implemented as a microprocessor, embedded processor, an application specific circuit, a programmable circuit, a microcontroller, or another similar device. The memory 140 contains instructions, which, when executed by the controller 130, enable the processing system 100 to perform the functions described herein. This memory 140 may be a non-volatile memory, such as a ROM (read only memory), an electrically erasable ROM, or other suitable non-volatile memory device or devices. In other embodiments, the memory 140 may be a volatile memory, such as a RAM (random access memory), DRAM (dynamic random access memory), or other suitable volatile memory device or devices. For further embodiments, the controller 130 is coupled to a data storage system 150 that stores data, models, control limits, update rates, or other process parameters used in the measurement and control techniques described herein. Variations can also be implemented.

The controller 130 can be configured communicate with the electronics 110 and/or the sensors 104 within the process chamber 120 through a variety of techniques. For example, controller 130 can include an RF transceiver configured to communicate with an RF transceiver included within the electronics 110 where the communication path 112 is an RF port or window. Controller 130 can include an optical transceiver to communicate with an optical transceiver included within the electronics 110 where the communication path 112 is an optical port or window. Other wireless communication devices can also be used for the controller 130 and the electronics 110. Further, wired communication connections can also be implemented between the controller 130 and the electronics 110. It is further noted that the communications between the controller 130 and the electronics 110 can be unidirectional or bidirectional.

Figure 2A:
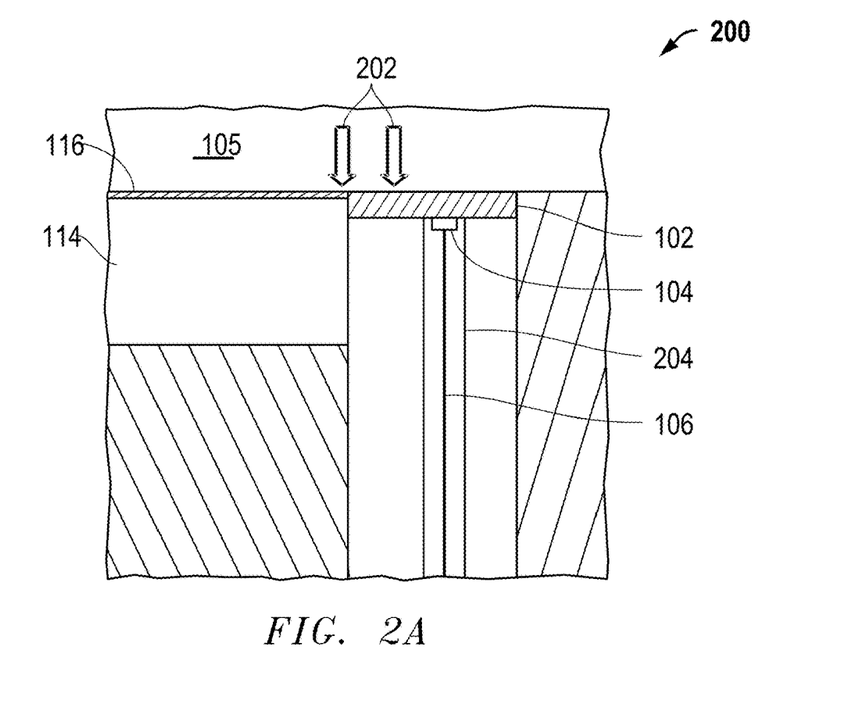
FIG. 2A is a cross-section diagram of an example embodiment for a portion of the process chamber shown in FIG. 1 including the sensor and the focus ring.

FIG. 2A is a cross-section diagram of an example embodiment 200 for a portion of the process chamber 120 shown in FIG. 1 including the sensor 104 and the focus ring 102. Embodiment 200 shows in part a portion of the processing region 105, a portion of the microelectronic workpiece 116, and a portion of the substrate holder 114. As described above, the sensor 104 is positioned under the focus ring 102, and a wire 106 extends to sensor electronics 110 as shown in FIG. 1. During operation, the microelectronic workpiece 116 as well as the focus ring 102 are subjected to process chemistries within the process chamber 120. For example, ions 202 associated with plasma gasses ignited within the chamber 120 can be received by the microelectronic workpiece 116 and the focus ring 102. The focus ring 102 is positioned at the edge of the microelectronic workpiece 116 and surrounds it within the process chamber 120. The microelectronic workpiece 116 is supported on the substrate holder 114 within the process chamber 120.

For one embodiment, a focus ring (FR) lift pin 204 is positioned underneath the focus ring 102, and this lift pin 204 is used to adjust the position of the focus ring 102 within the process chamber 120. The sensor 104 can be positioned under the focus ring 102 within the top end portion of the FR lift pin 204. Although not shown, the sensor 104 can also be positioned in other portions of the FR lift pin 204 such as a bottom end portion of the FR lift pin 204. Additional sensors 104 can also be similarly positioned with respect to additional FR lift pins 204 and used as described herein.

Figure 2B:
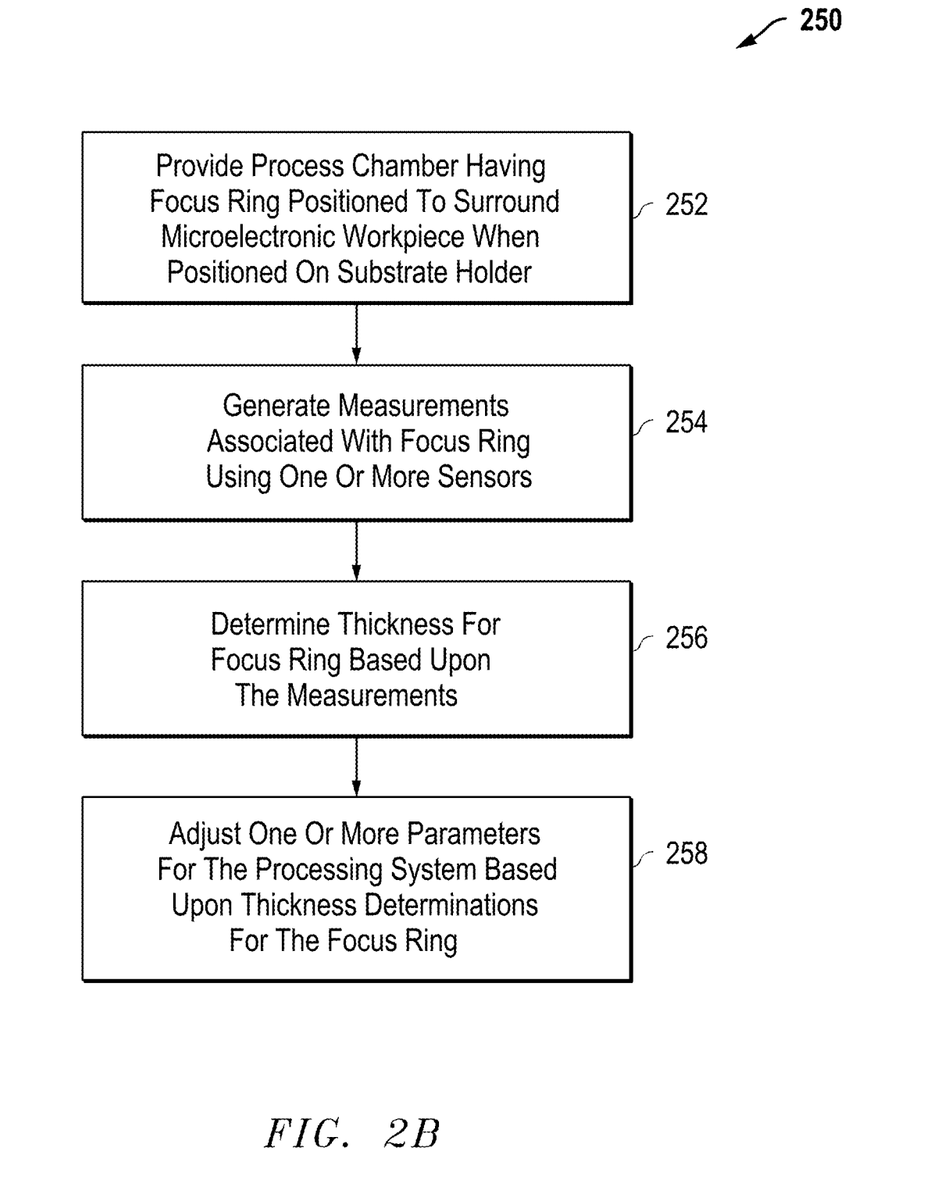
FIG. 2B is a process diagram of an example embodiment where measurements from one or more sensors are used to make thickness determinations for a focus ring and to adjust process parameters based upon the thickness determinations.

FIG. 2B is a process diagram of an example embodiment 250 where measurements from one or more sensors 104 are used to make thickness determinations for a focus ring 102 and to adjust process parameters based upon the thickness determinations. In block 252, a process chamber is provided having a focus ring 102 positioned to surround a microelectronic workpiece 116 when positioned on a substrate holder 114. In block 254, measurements associated with the focus ring are generated using one or more sensors. In block 256, a thickness for the focus ring is determined based upon the measurements. In block 258, one or more parameters for the processing system are adjusted based upon thickness determinations for the focus ring 102. It is noted that additional and/or different process steps can also be implemented while still taking advantage of the techniques described herein.

For one embodiment, change in capacitance associated with a focus ring 102 is used to determine thickness for the focus ring 102. An initial capacitance is measured for a known focus ring thickness, for example, when the focus ring 102 is manufactured or installed. Subsequent capacitance measurements within the process chamber 120 are then used to determine the current or remaining thickness for the focus ring 102. Measurements for this embodiment can be made using signals capacitively coupled to the focus ring 102, for example, without direct metal contacts as shown in more detail with respect to FIGS. 5-6. This capacitance method is useful, for example, where a focus ring 102 is a non-metallic material. It is noted, however, that the capacitance method can also be used for focus rings 102 made from other materials. Capacitive measurement embodiments are described in more detail with respect to FIGS. 5A-5B below.

For one embodiment, an ultrasonic technique is used to determine a thickness for the focus ring 102. For example, an ultrasonic signal is applied to the focus ring 102 and reflected energy is used to determine a thickness for the focus ring 102. Measurements for this embodiment can be made through direct ultrasonic signal measurement and can occur, for example, through dielectric materials stacked under the focus ring 102. This ultrasonic method is useful, for example, where the focus ring 102 is a doped silicon material. It is noted, however, that the ultrasonic method can also be used for focus rings 102 made from other materials.

Figure 3:
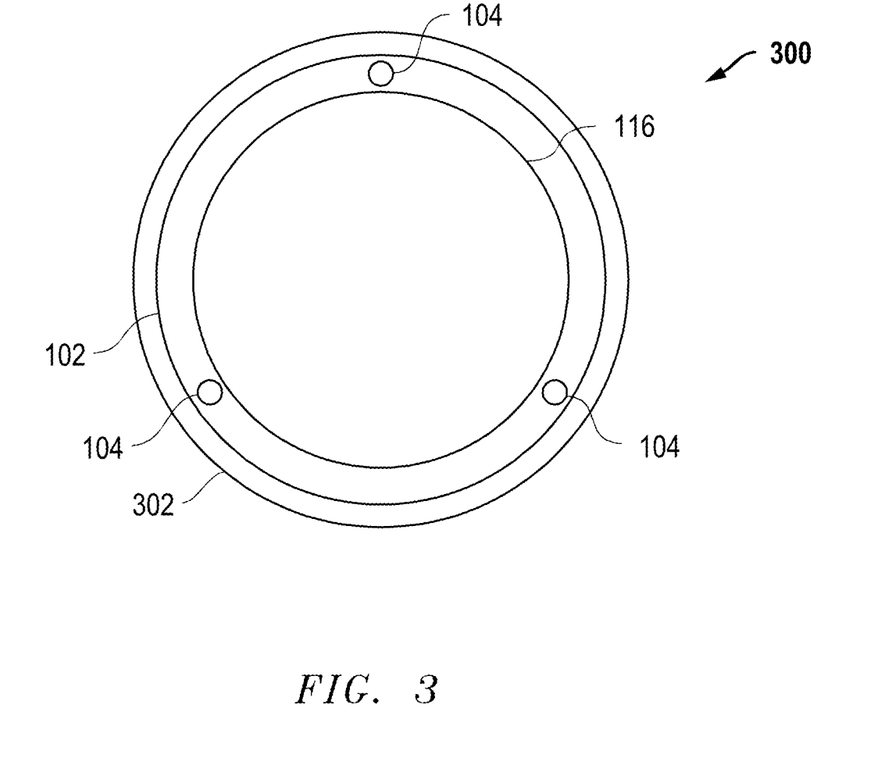
FIG. 3 is a top view diagram of an example embodiment for positioning of sensors, such an ultrasonic sensors, with respect to a focus ring within a process chamber.

FIG. 3 is a top view diagram of an example embodiment 300 for positioning of sensors 104, such an ultrasonic sensors, with respect to a focus ring 102 within a process chamber 120 as shown in FIG. 1. For the example embodiment 300, a microelectronic workpiece 116, such as a semiconductor wafer, is surrounded by the focus ring 102. An outer dielectric material 302 can be adjacent and positioned to surround the focus ring 102. The sensors 104 are positioned under the focus ring 102 and multiple sensors can be used. As indicated above, the sensors 104 are ultrasonic sensors for one embodiment. The ultrasonic sensors can include one or more sonic sensors having operating frequencies above 20 kHz and up to 500 MHz or higher. Further, these ultrasonic sensors can be positioned in the top portions of FR lift pins 204 as shown in FIG. 2A. For the embodiment 300, for example, the locations for the sensors 104 can represent locations for three FR lift pins 204. Other variations can be implemented.

Figure 4A:
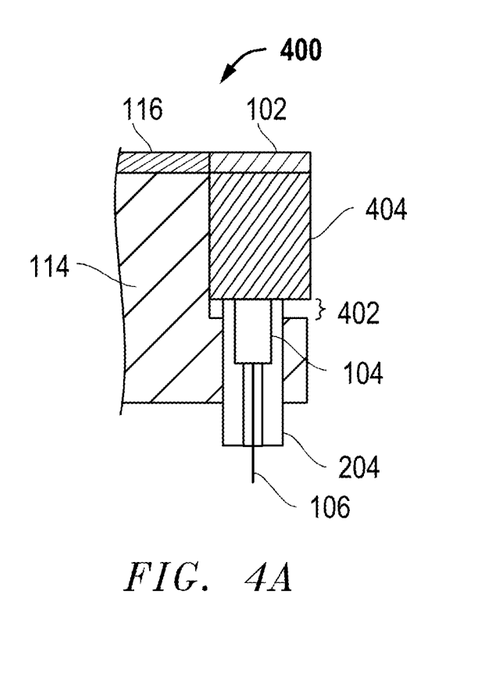
FIGS. 4A-4D are cross-section diagrams of example embodiments where ultrasonic sensors are used to measure physical parameters associated with the focus ring.

For example, as described herein, capacitive sensors, resistive sensors, and/or other sensor types can be used for sensors 104 instead of and/or in addition to ultrasonic sensors. Further, the sensors 104 can take various configurations and shapes depending upon the type of sensor being implemented. For example, in one embodiment a sensor 104 is implemented as a continuous ring positioned under the focus ring 102. Such as continuous ring embodiment may be useful to avoid azimuthal perturbations. For another embodiment, sensors 104 is implemented as a plurality of non-continuous ring segments positioned under and distributed around the focus ring 102. Other configurations for sensors 104 can also be implemented while still taking advantage of the techniques described herein for focus ring thickness determination FIG. 4A is a cross-section diagram of an example embodiment 400 where an ultrasonic sensor is used for sensor 104. A portion of a microelectronic workpiece 116, a substrate holder 114, and a focus ring 102 are also shown for embodiment 400. For embodiment 400, the ultrasonic sensor 104 is positioned under the focus ring 102. A dielectric material 404 can also positioned between the focus ring 102 and the ultrasonic sensor 104. For example, this dielectric 404 can be provided so that no metal or direct contact is created. Additional dielectric (not shown) can also be positioned adjacent the outer edge of the structure shown including adjacent the outer edge of the focus ring 102. Further, the ultrasonic sensor 104 can be positioned within a top end portion of a FR lift pin 204 as described above with respect to FIG. 2A. A connection wire 106 extends from the ultrasonic sensor 104 to electronics 110 positioned within the process chamber 120 as described above with respect to FIG. 1. Where FR lift pins 204 used, it is again noted that the sensor 104 can be positioned in other portions of the FR lift pin 204 including a bottom end portion of the FR lift pin 204. For embodiments described herein with the FR lift pin 204 is adjusted based upon thickness determinations, the gap 402 will increase or decrease depending upon the relatively position for the FR lift pin 204.

Figure 4B:
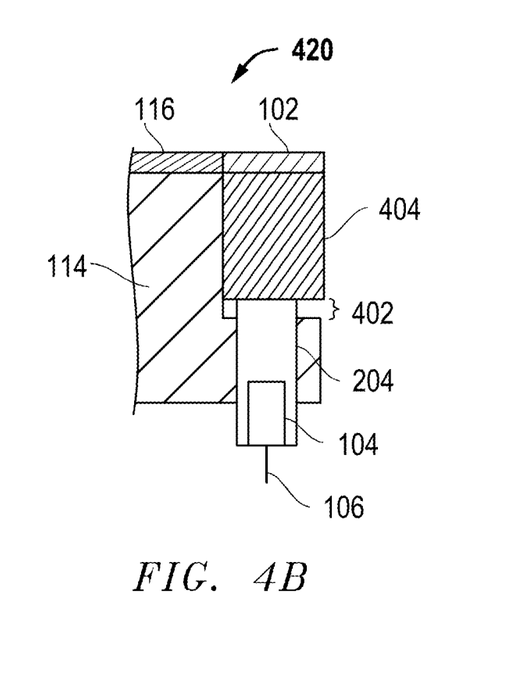

FIG. 4B is a cross-section diagram of an example embodiment 420 where an ultrasonic sensor is used for sensor 104 and is positioned in a bottom end portion of the FR lift pin 204. The ultrasonic sensor 104 is still positioned under the focus ring 102 but is further from the focus ring 102 than the embodiment 400 in FIG. 4A. A dielectric material 404 is positioned between the focus ring 102 and the FR lift pin 204 so that no metal or direct contact is created. With the ultrasonic sensor 104 positioned within the bottom end portion of the FR lift pin 204, the FR lift pin 204 is used as a waveguide to deliver the ultrasonic pulse generated by the sensor 104 to the focus ring 102. A connection wire 106 extends from the ultrasonic sensor 104 to electronics 110 positioned within the process chamber 120 as described above with respect to FIG. 1.

Figure 4C:
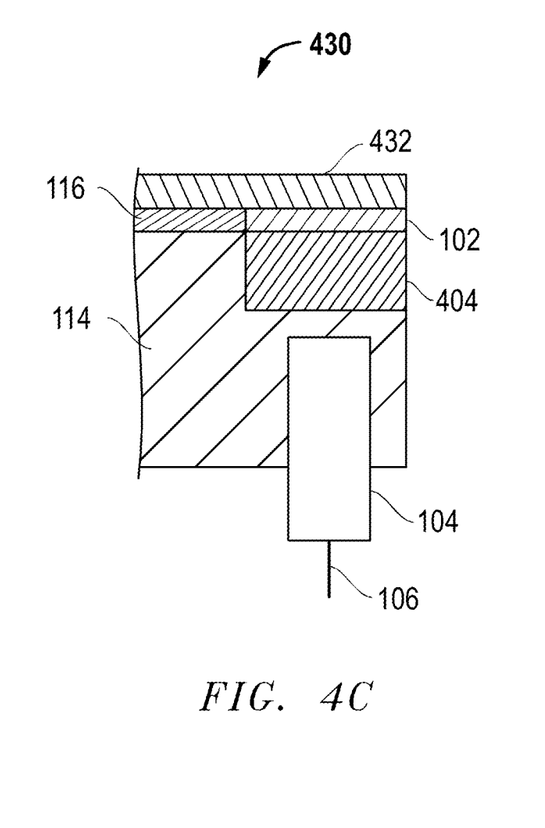

FIG. 4C is a cross-section diagram of an example embodiment 430 where an ultrasonic sensor is used for sensor 104 and is positioned below a stack of materials including a focus ring 102, a substrate holder 114, and a dielectric material 404. For example embodiment 430, the sensor 104 is positioned within the substrate holder 114. As described herein, the focus ring 102 is positioned around a microelectronic workpiece 116. For plasma processing within process chamber 120, a plasma sheath 432 is formed above the microelectronic workpiece 116. For one embodiment, the substrate holder 114 is an electrostatic chuck (ESC); the dielectric material 404 is quartz; and the microelectronic workpiece 116 is a semiconductor wafer. As described herein, a connection wire 106 extends from the ultrasonic sensor 104 to electronics 110 positioned within the process chamber 120 as described above with respect to FIG. 1. It is again noted that additional dielectric (not shown) can also be positioned adjacent the outer edge of the structure shown including adjacent the outer edge of the focus ring 102. It is further noted that air gaps or vacuum gaps between materials are preferably minimized or eliminated.

Figure 4D:
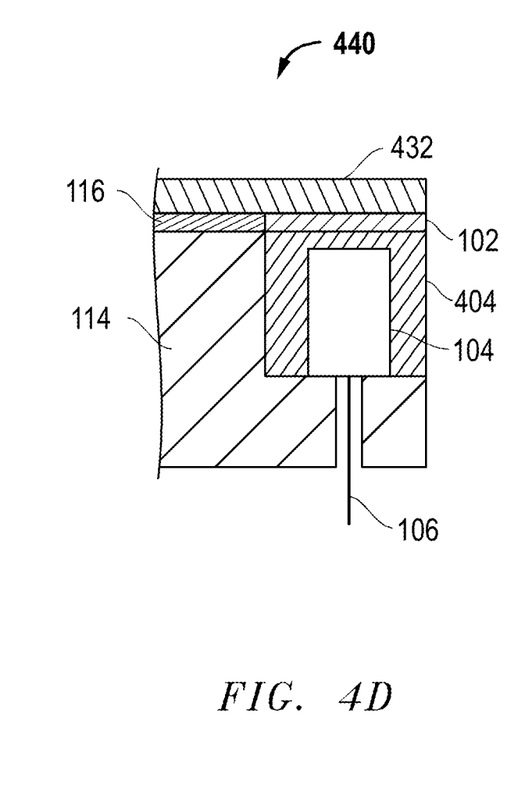

FIG. 4D is a cross-section diagram of a further example embodiment 440 where an ultrasonic sensor is used for sensor 104 and is positioned below a stack of materials including a focus ring 102, a substrate holder 114, and a dielectric material 404. Example embodiment 440 is similar to the embodiment 430 in FIG. 4C except that the sensor 104 is included within the dielectric material 404 rather than within the substrate holder 114. It is again noted that air gaps or vacuum gaps between materials are preferably minimized or eliminated. As described above, a connection wire 106 extends from the ultrasonic sensor 104 to electronics 110 positioned within the process chamber 120 as described above with respect to FIG. 1.

It is noted that the sensors 104 for the ultrasonic embodiment can be implemented using one or more ultrasonic transducers. Ultrasonic transducers generate and transmit an ultrasound pulse and receive signals reflected from the object or material being measured. These reflected signals are then analyzed. As described herein, ultrasonic measurements made by the ultrasonic sensors 104 are used to determine the thickness of the focus ring 102. It is again noted that different types of sensors and related measurements can be used. For example, in addition to making ultrasonic measurements, the sensors 104 can be implemented to make capacitive measurements, resistive measurements, and/or other desired measurements to determine the thickness of the focus ring 102. Further, combinations of measurements types can be made. Other variations can also be implemented while still taking advantage of the techniques described herein.

Figure 4E:
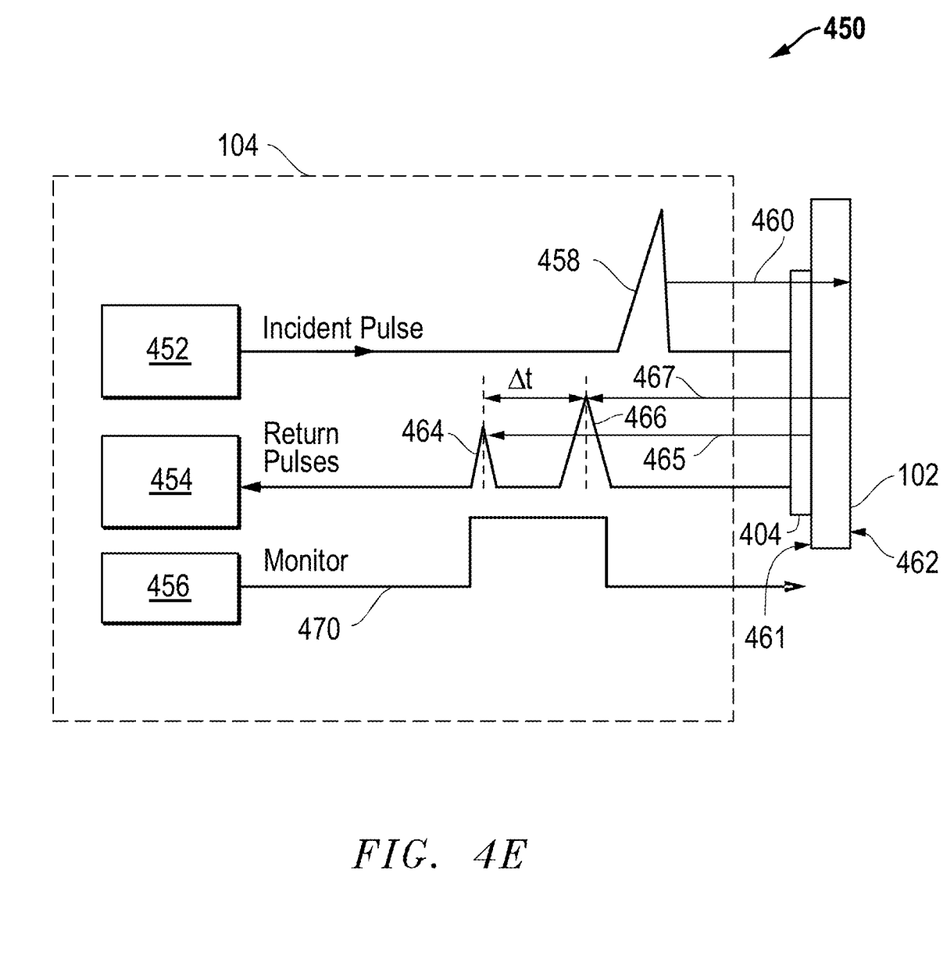
FIG. 4E is a diagram of an example embodiment for multilayer ultrasonic measurements associated with the ultrasonic sensor embodiment of FIGS. 4A-4D.

FIG. 4E is a diagram of an example embodiment 450 for multilayer ultrasonic measurements associated with the ultrasonic sensor embodiments of FIGS. 4A-4D. As indicated above, the ultrasonic sensor 104 generates and transmits one or more ultrasonic pulses 458 and receives return pulses 464/466. For example, the ultrasonic sensor 104 can be an ultrasound transducer that includes an ultrasound generator or transmitter 452 and ultrasound receiver 454. As indicated by arrow 460, the ultrasonic pulse 458 is delivered as an ultrasonic incident pulse to the focus ring 102. For one embodiment, a dielectric material 404 is positioned between the sensor 104 and the focus ring 102.

During operation, incident pulses 458 are generated and transmitted to the focus ring 102 by the generator or transmitter 452 for sensor 104. Return pulses 464/466 are then received back by the receiver 454 for sensor 104. For example, changes in refractive index of materials through which the ultrasound pulse 458 passes cause reflections of the ultrasound energy causing the return pulses 464/466. These return pulses 464/466 are detected and monitored by the sensor 104. For example, a first return pulse 464 is associated with a first surface 461 of the focus ring 102, and a second pulse 466 is associated with a second surface 462 of the focus ring 102. The difference in time (Δt) for peaks associated with the return pulses 464/466 as represented by arrows 465/467 can be used to generate a measurement output as represented by monitor output signal 470. This monitor output signal 470, for example, can be communicated through connection wire 106 to electronics 110, as shown in FIG. 1.

It is noted that the difference in time (Δt) for peaks associated with the return pulses 464/466 along with refractive index (n) for the material of the focus ring 102 are used to determine a thickness (d) for the focus ring 102 for each measurement iteration (i). For example, the following equation can be used: $d_i = \Delta t_i / n$, where the "i" subscript indicates the measurements for an iteration. These thickness determinations can be made by electronics 110 within the process chamber 120 or can be made by external circuitry. Variations can be implemented.

It is further noted that measurement frequencies for the thickness detection can also be selected or adjusted depending upon the materials being used for the focus ring 102, depending upon the process chamber 120 within which the focus ring 102 is installed, and/or other factors. One or more ultrasonic sensors 104 can also be used, and signal processing circuitry for the electronics 110 or for external circuitry can be adjusted depending upon the frequencies and types of sensors used from particular implementations.

Still further, it is noted that return pulses 464/466 are provided as one example for return pulses that can be generated and used for thickness determinations. Additional and/or different return pulses can also be generated and used. For example, the dielectric material 404 may also generate a return pulse due to changes in refractive index. For example, where the sensor 104 is positioned at the bottom of the FR lift pin 204 (e.g., where the FR lift pin 204 is adjusted based upon thickness measurements for the focus ring 102), the FR lift pin 204 is one of the layers that the signal is propagating though and that provides a constant reflected surface. As such, although FIG. 4E shows only two reflected pulses 464/466, a more complex set of reflect pulses could be received and resolved in practice, and one or more fixed position layers can be used for calibration. Further, multiple frequencies can be used for the incident pulses 458 and sequencing through different frequencies can be used to facilitate measurements depending upon the materials and positioned of components used for any particular implementation.

For one further embodiment, the return pulses generated from incident pulses are used to make thickness determinations for other materials or layers within the process chamber 120 in addition to the focus ring 102. For example, with respect to the embodiment 430 of FIGS. 4C-4D, thickness determinations can be made for the substrate holder 114, the dielectric material 404, and the plasma sheath 432 in addition to the focus ring 102. Each of these materials or layers will cause reflected pulses due to changes in refractive indexes. Further, frequencies for the incident pulses can be adjusted or cycled to better detect the various materials or layers. In addition, some of these materials or layers, such as the substrate holder 114, can be used for calibration as they are not expected to change in thickness during operation of the process chamber 120. Other variations can also be implemented while still taking advantage of the techniques described herein.

Measurements of the focus ring 102, substrate holder 114, dielectric material 404, and/or other solid materials or layers are preferably made between wafer processing. For example, measurements can be made while a processed wafer or microelectronic workpiece 116 is being removed and the next wafer or microelectronic workpiece 116 is positioned for processing within the process chamber 120. This provides a low noise environment without any RF interference, for example, due to plasma generation within the process chamber 120. It is noted, however, that these measurements can be made during plasma generation if desired. Further, the transmitter 452 and the receiver 454 are preferably separated by a distance of 1 mm or less for these measurements, although different spacing can also be used. Other variations can also be implemented.

Measurements of the plasma sheath 432, however, will be made while plasma is being generated within the process chamber 120. For example, measurement of the plasma sheath 432 can be made in real-time by detecting changes in plasma sheath thickness during a pulse and during the wafer processing at each process recipe step. Design and placement of the sensor 104 can also be optimized to facilitate plasma sheath measurement, for example, by spacing the transmitter 452 and the receiver 454 such that they are separated by a distance in a range of from 1 mm to 200 mm. For one embodiment, an operational frequency range of 3 to 30 MHz can be selected for the transmitter and receiver 452/454 to leverage the reflective surface of the sheath boundary being made by a dense layer of electrons and ions. Alternatively, the transmitter and receiver 452/454 can be designed to measure the sheath at lower frequencies such as with an operational frequency range of 50 to 400 kHz. Other variations could also be implemented.

Figure 5A:
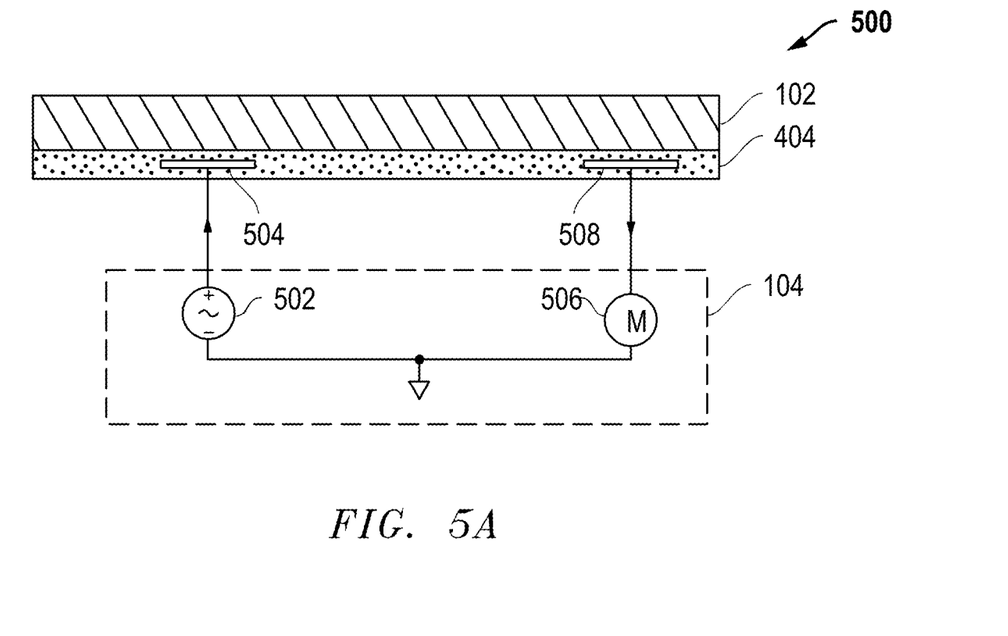
FIG. 5A is a diagram of an example embodiment for single-ended capacitive measurements with respect to a capacitive sensor used to measure physical parameters associated with the focus ring.
Figure 5B:
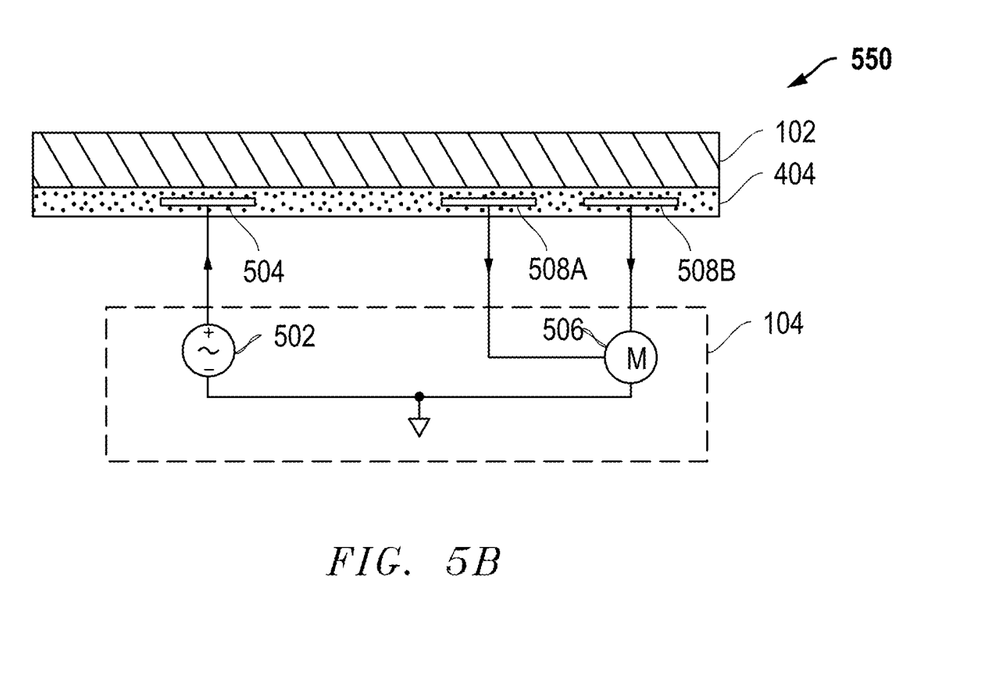
FIG. 5B is a diagram of an example embodiment for differential capacitive measurements with respect to a capacitive sensor used to measure physical parameters associated with the focus ring.

As indicated above, the sensors 104 can also be used to make capacitive measurements. These capacitive measurements can also be used to determine the thickness of the focus ring 102. FIGS. 5A-5B provide example embodiments for capacitive sensor solutions that use single-ended or differential capacitive measurements.

Looking first to FIG. 5A, an example embodiment 500 is provided for single-ended capacitive measurements with respect to a sensor 104. For the embodiment depicted, a laminated material stack is shown with the focus ring 102 positioned on top of a dielectric material 404. For example, the dielectric material 404 can be implemented as a ring positioned underneath the focus ring 102. A capacitor plate 504 is embedded within the dielectric material 404 and is used to deliver excitation signals from the signal generator 502. A capacitor plate 508 is also embedded within the dielectric material 404 and is used to measure changes in capacitance. The measurement circuit (M) 506 receives a signal from the capacitor plate 508 to provide the single-ended capacitive measurement. As such, the dielectric material 404 provides a capacitive measurement layer below the focus ring 102. The signal generator 502 can generate an alternating current (AC) signal. The AC signal is applied at a first point represented by capacitor plate 504, and a capacitive measurement is made at a second point represented by capacitor plate 508. These capacitive measurements are then used to determine thickness of the focus ring 102. For example, changes in material dielectric constants can be associated with a change in thickness of the focus ring 102.

For one embodiment, a thickness model is generated based upon calibration focus rings of known thicknesses, and then this thickness model is used to determine remaining thickness over time for a focus ring 102 installed within a process chamber 120 as shown in FIG. 1. For example, capacitive measurements can be initially made within the process chamber 120 without a focus ring 102. Measurements are then made with a calibration focus ring in place as the focus ring 102 within the chamber 120. Measurements are also made with different calibration focus rings of different known thicknesses. A model is then generated for a relationship of measured capacitance to thickness for the calibration focus rings. A new focus ring 102 is then installed and put in operation within the process chamber 120. Measurements are made over time after multiple intervening processing cycles. The thickness model is then used to determine the remaining thickness for the focus ring 102 as the process chamber 120 is used over time to process different microelectronic workpieces 116.

FIG. 5B provides an example embodiment 550 for differential capacitive measurements with respect to a sensor 104. Embodiment 550 is similar to embodiment 500 except that the measurement circuit (M) 506 receives input signals from a first measurement capacitor plate 508A and a second measurement capacitor plate 508B. These signals from the capacitor plates 508A/508B provide the differential capacitive measurement. The operation of embodiment 550 is otherwise the same as the operation of embodiment 500 described above except for the differential capacitive measurement using capacitor plates 508A/508B rather than the single-ended capacitive measurement using capacitor plate 508 shown in FIG. 5A.

It is noted that the signal generator 502 can be used to generate single and dual frequency excitation that can be used for single-ended measurements in FIG. 5A or for the differential measurements in FIG. 5B. For one embodiment, the output rate or frequency for the excitation signal generated by the signal generator 502 can be software programmable, and the output rate or frequency can be varied from 5 Hz to 90 Hz. For one embodiment, 16.6 Hz is used as the output rate or frequency, and this 16.6 Hz signal achieves simultaneous rejection of potentially interfering 50 Hz and 60 Hz signals. Such 50 Hz to 60 Hz interfering signals can be generated, for example, from power supplies attached to the processing equipment. It is noted that an integrated circuit that provides capacitance-to-digital conversion can be used in part to implement that sensor 104 for the embodiments 500/550 in FIGS. 5A-5B. Such capacitance-to-digital converter ICs generate programmable excitation signals to excitation capacitor plates and can receive single-ended or differential return signals from measurement capacitor plates.

Figure 6:
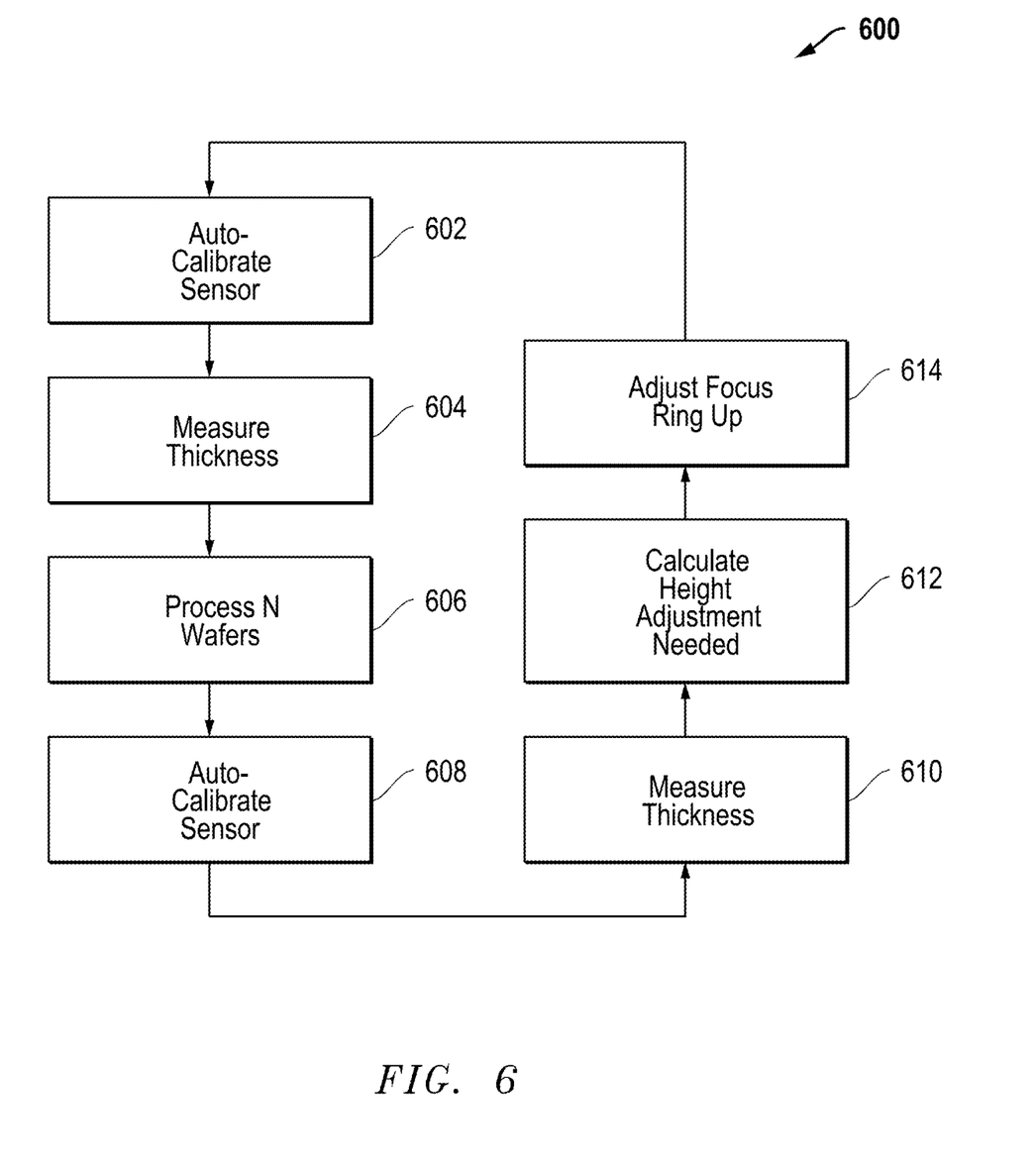
FIG. 6 is a process flow diagram of an example embodiment for adjustment of the position of a focus ring within a process chamber based upon feedback from thickness determinations.

For certain embodiments as described in more detail with respect to FIG. 6, closed loop calibration is implemented to adjust a position of the focus ring 102 within the process chamber 120 based upon feedback. For example, the initial known thickness for the focus ring 102 and any material stack under the focus ring 102 are used along with later measurements of remaining thickness to adjust automatically the position of the focus ring 102. For example, one or more FR lift pins 204, as shown and described with respect to FIGS. 2-3 above, can be adjusted to raise the height of the focus ring 102 to compensate for deterioration or erosion in thickness determined from the measurements. This closed loop calibration can also be combined with customer factory update reporting and process control system updates.

Now looking to FIG. 6, a process flow diagram is provided as an example embodiment 600 for adjustment of the position of the focus ring 102 based upon feedback from thickness determinations. For this embodiment, the sensor 104 is auto-calibrated in an initial block 602. Next in block 604, the thickness for the focus ring 102 is then determined using one or more sensors 104 as described herein. A number (N) of different wafers or microelectronic workpieces 116 are then processed within the process chamber 120 as represented by block 606. In block 608, the sensor 104 is auto-calibrated again. In block 610, the thickness of the focus ring 102 is again measured. In block 612, changes in the thickness are determine for the focus ring 102, and a height adjustment calculation is made as necessary to adjust the height of the focus ring 102 based upon these changes in thickness. In block 614, the position of the focus ring 102 is adjusted within the process chamber 120 to account for the changes in thickness for the focus ring 102. These changes in thickness will typically represent deterioration or erosion to the focus ring 102 due to processing cycles within the process chamber 120. For example, a FR lift pin within the process system can be used to push up the focus ring. It is noted that additional and/or different process steps can also be used. The process then flows back to block 602; however, the previous auto-calibration and thickness measurement results can be stored and are known for the subsequent steps shown in FIG. 6 and for future detection cycles. Different and/or additional steps could also be used while still taking advantage of the thickness determination techniques described herein.

It is noted that the material for the focus ring 102 as well as the FR lift pins 204 can be made from a variety of materials. For example, conductive silicon, quartz, non-conductive silicon, or other material can be used. Further, FR lift pins 204 can be included or not included in embodiments. For example, where FR lift pins 204 are included, thickness measurements based upon sensors 104 can be used as feedback to adjust automatically the height of the focus ring 102 based upon measured thickness variations over time as described with respect to FIG. 6. Where FR lift pins 204 are not included, the thickness measurements can be used to adjust process parameters, to determine when a focus ring 102 has deteriorated beyond acceptable levels and should be replaced, to determine focus ring thickness variations across different process chambers to match process parameters across the different process chambers, and/or to allow other actions based upon thickness variations detected over time. It is further noted that additional circuits can also be included within the embodiments described herein to provide thermal protection, radio frequency (RF) protection (e.g., from 13 megahertz or other RF signals), electrostatic discharge (ESD) protection, high voltage protection, and/or other protection for the thickness detection embodiments described herein.

A variety of calibration routines and techniques can also be used. For example, layers of constant and known thickness can be included within the measurement layer stack to facilitate calibration, such as zero calibration, for the FR thickness detection measurements. An initial known FR thickness can also be used for calibration. In addition, number of operational hours (e.g., hours FR is subjected to RF energy) can be used along with other parameter inputs to provide predictive thickness calculations based upon one or more predictive models.

For one embodiment, a known layer in the stacked material associated with the sensor 104, such as a known dielectric material 404, is used as a calibration reference at each measurement. Further, the initial thickness for the focus ring 102 upon installation, which is known, can be used for calibration.

Control circuitry for measurement and calibration can also be included. Output measurement signals for the sensors 104 are routed to electronics 110 within the process chamber 120 and to external circuits through communication paths 112 such as ports or windows as described with respect to FIG. 1. Measurement and control electronics, including software and/or hardware, can be located within the process chamber, outside the process chamber, or combinations of both inside and outside the process chamber. Wired and/or wireless connections can also be provided for communications to a control system for the process chamber. As indicated above with respect to FIG. 1, a data storage system 150 can also be included to store data, models, control limits, update rates, or other parameters used in the measurement and control techniques described herein. The information stored within the data storage system 150 can also be updated or programmed through wired and/or wireless communications, including network communications. Variations of measurement and control electronics can also be implemented.

Figure 7:
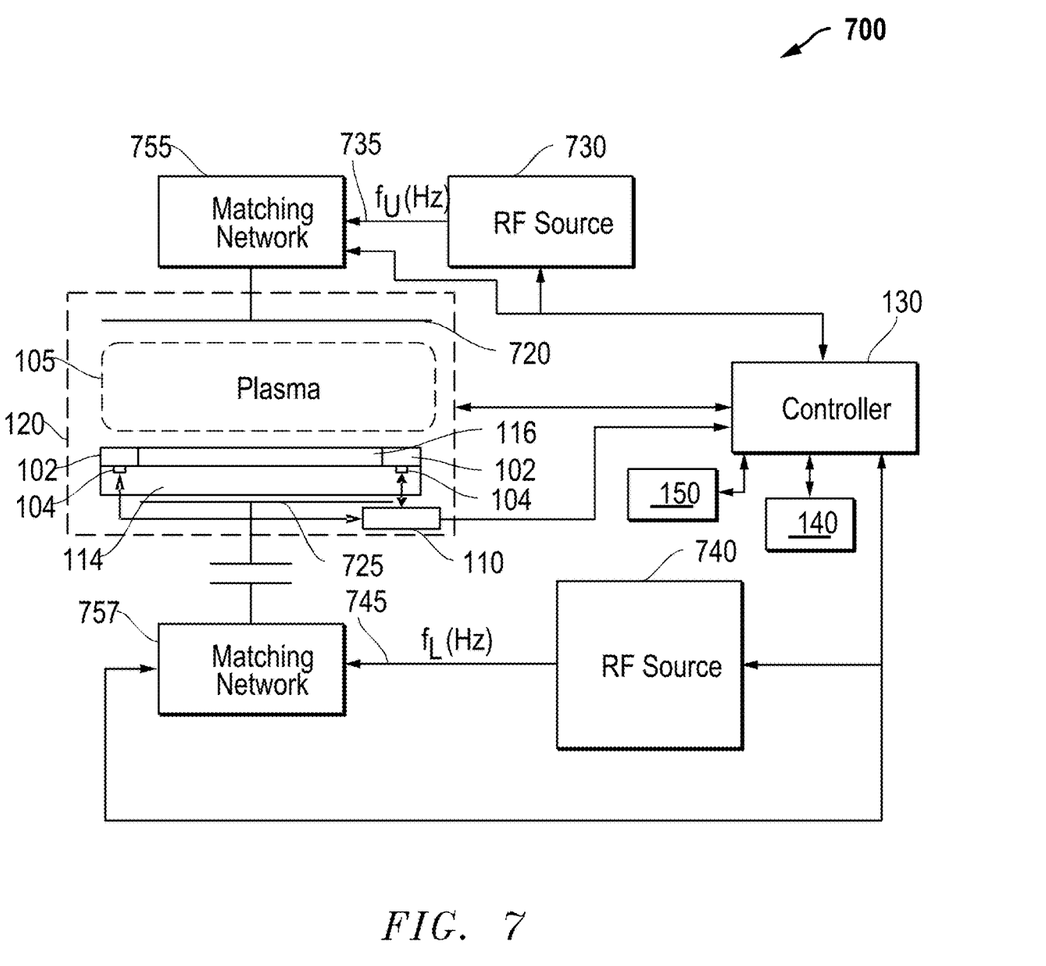
FIG. 7 provides one example embodiment for a plasma processing system that can implement the focus ring thickness determination techniques described for the embodiment herein.

FIG. 7 provides one example embodiment for a plasma processing system 700 that can be used to implement the focus ring thickness determination techniques described herein. The processing system 700 can include a controller 130, a memory 140, and a data storage system 150 as described with respect to FIG. 1. The controller 130 can execute programming instructions stored within the memory 140 to implement the functions described herein. The data storage system 150 is also coupled to the controller 130 and stores data, models, control limits, update rates, or other parameters used in the measurement and control techniques described herein. During operation, the controller 130 receives measurements from the sensors 104 associated with physical parameters for the focus ring 102. The sensors 104, for example, can be positioned adjacent, underneath, or otherwise with respect to the focus ring 102 within the process chamber 120 to make these measurements. The controller 130 operates as external circuitry that facilitates the thickness determinations and related actions taken based upon those determinations. Further, the controller 130 can be coupled to the sensors 104 through electronics 110 that are also positioned within the process chamber 120.

The plasma processing system 700 may be a capacitively coupled plasma processing apparatus, inductively coupled plasma processing apparatus, microwave plasma processing apparatus, surface wave plasma operating at radio frequencies, electron cyclotron resonance (ECR) plasma processing apparatus, helical resonator processing apparatus, or other type of processing system or combination of systems. Thus, it will be recognized by those skilled in the art that the techniques described herein may be utilized with any of a wide variety of plasma processing systems. The plasma processing system 700 can be used for a wide variety of operations including, but not limited to, etching, deposition, cleaning, plasma polymerization, plasma-enhanced chemical vapor deposition (PECVD), atomic layer deposition (ALD) and so forth. The structure of a plasma processing system 700 is well known, and the particular structure provided herein is merely of illustrative purposes. It will be recognized that different and/or additional plasma process systems may be implemented while still taking advantage of the techniques described herein.

As is known in the art, the process chamber 120 may be a pressure-controlled chamber. A microelectronic workpiece 116 (in one example a semiconductor wafer) may be held on a substrate holder 114. An upper electrode 720 and a lower electrode 725 may be provided as shown. The upper electrode 720 may be electrically coupled to an upper RF source 730 through an upper matching network 755. The upper RF source 730 may provide an upper frequency voltage 735 at an upper frequency ($f_U$). The lower electrode 725 may be electrically coupled to a lower RF source 740 through a lower matching network 757. The lower RF source 740 may provide a lower frequency voltage 745 at a lower frequency ($f_L$). Though not shown, it will be known by those skilled in the art that a voltage may also be applied to the substrate holder 114.

Components of the plasma processing system 700 can be connected to, and controlled by, a controller 130 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma process chamber with various microfabrication techniques. It will be recognized that controller 130 may be coupled to various components of the plasma processing system 700 to receive inputs from and provide outputs to the components.

The controller 130 can be implemented in a wide variety of manners. For example, the controller 130 can be a computer. Further, the controller 130 can be implemented using one or more programmable integrated circuits that are programmed to provide the functionality described herein. For example, one or more processors (e.g., microprocessor, microcontroller, central processing unit, etc.), programmable logic devices (e.g., CPLD (complex programmable logic device), FPGA (field programmable gate array), etc.), and/or other programmable integrated circuits can be programmed with software or other programming instructions to implement the functionality described herein. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. For example, software or other programming instructions can be stored in memory 140 and/or data storage system 150. Other variations could also be implemented.

In operation, the plasma processing apparatus uses the upper and lower electrodes to generate a plasma within a processing region 105 in the process chamber 120 when applying power to the system from the upper RF source 730 and the lower RF source 740. Further, as is known in the art, ions generated in the plasma may be attracted to the microelectronic workpiece 116. The generated plasma can be used for processing a target substrate (such as microelectronic workpiece 116 or any material to be processed) in various types of treatments such as, but not limited to, plasma etching, chemical vapor deposition, treatment of semiconductor material, glass material and large panels such as thin-film solar cells, other photovoltaic cells, and organic/inorganic plates for flat panel displays, and/or other materials.

Application of power results in a high-frequency electric field being generated between the upper electrode 720 and the lower electrode 725. Processing gas delivered to process chamber 120 can then be dissociated and converted into a plasma. As shown in FIG. 7, the exemplary system described utilizes both upper and lower RF sources. For example, high-frequency electric power, for an exemplary capacitively coupled plasma system, in a range from about 3 MHz to 150 MHz may be applied from the upper RF source 730 and a low frequency electric power in a range from about 0.2 MHz to 40 MHz can be applied from the lower RF source. It will be recognized that the techniques described herein may be utilized with in a variety of other plasma systems. In one example system, the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized, etc.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to photoresist (PR) layers can be implemented using optical lithography, extreme ultra-violet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A processing system, comprising:
   a process chamber including a substrate holder;
   a focus ring positioned to surround a microelectronic workpiece when positioned on the substrate holder;
   one or more sensors within the process chamber, the one or more sensors generating measurements associated with the focus ring;
   a dielectric material positioned between the focus ring and a surface of the one or more sensors, the surface being one through which the measurements associated with focus ring are generated, the surface having a normal which intersects the focus ring, the dielectric material being in contact with the focus ring, and the one or more sensors being in contact with the dielectric material; and
   a controller coupled to adjust one or more parameters for the processing system based upon thickness determinations for the focus ring based upon the measurements.

2. The processing system of claim 1, wherein the thickness determinations are based upon a model relating the measurements to focus ring thickness.

3. The processing system of claim 1, wherein the one or more sensors are configured to provide ultrasonic measurements associated with the focus ring.

4. The processing system of claim 3, further comprising one or more transmitters positioned to transmit ultrasonic pulses to the focus ring and one or more receivers configured to receive return pulses associated with surfaces of the focus ring, and wherein the thickness determinations are based upon time differences between the return pulses.

5. The processing system of claim 4, wherein the controller is further configured to determine a thickness for a plasma sheath formed above the microelectronic workpiece within the process chamber based upon return pulses.

6. The processing system of claim 1, wherein the one or more sensors comprise at least one of a continuous ring positioned under the focus ring or a plurality of ring segments positioned under the focus ring.

7. The processing system of claim 1, wherein the one or more sensors are configured to provide resistive measurements associated with the focus ring.

8. The processing system of claim 1, wherein the one or more sensors are configured to provide capacitive measurements associated with the focus ring based upon signals applied to the focus ring.

9. The processing system of claim 1, further comprising one or more lift pins configured to adjust a position of the focus ring within the process chamber.

10. The processing system of claim 9, wherein the controller is configured to automatically adjust the position of the focus ring using the one or more lift pins based upon the thickness determinations.

11. The processing system of claim 9, wherein the one or more sensors are positioned within end portions of the one or more lift pins.

12. The processing system of claim 1, wherein the controller is configured to calibrate the thickness determinations based upon known initial conditions for at least one material layer within the process chamber.

13. The processing system of claim 1, wherein the one or more sensors are positioned within the dielectric material.

14. A method for a processing system, comprising:
providing a process chamber having a focus ring positioned to surround a microelectronic workpiece when positioned on a substrate holder;
generating measurements associated with the focus ring using one or more sensors disposed within the processing chamber and separated from the focus ring via a dielectric material, the dielectric material being positioned between the focus ring and a surface of the one or more sensors;
adjusting a position of the focus ring within the process chamber using one or more lift pins;
determining a thickness for the focus ring based upon the measurements; and
adjusting one or more parameters for the processing system based upon thickness determinations for the focus ring, wherein
the one or more lift pins are positioned below the focus ring, and
the one or more sensors are positioned within the one or more lift pins.

15. The method of claim 14, wherein the determining comprises applying a model relating the measurements to focus ring thickness.

16. The method of claim 14, wherein the adjusting comprises replacing the focus ring based upon the thickness determinations.

17. The method of claim 14, wherein the generating comprises using the one or more sensors to generate ultrasonic measurements associated with the focus ring.

18. The method of claim 17, further comprising transmitting ultrasonic pulses to the focus ring and measuring return pulses associated with surfaces of the focus ring, and wherein the determining is based upon time differences between the return pulses.

19. The method of claim 14, wherein the providing, generating, and determining are performed for a plurality of process chambers, and wherein the adjusting is performed to match process parameters across the plurality of process chambers.

20. The method of claim 14, wherein the generating comprises using the one or more sensors to generate resistive measurements associated with the focus ring.

21. The method of claim 14, wherein the generating comprises applying excitation signals to the focus ring and using the one or more sensors to generate capacitive measurements associated with the focus ring.

22. The method of claim 14, further comprising automatically adjusting the position of the focus ring using the one or more lift pins based upon the determining.

23. The method of claim 14, wherein the one or more sensors are positioned within end portions of one or more lift pins.

24. The method of claim 14, further comprising calibrating the determining based upon known initial conditions for at least one material layer within the process chamber.

\* \* \* \* \*

UNITED STATES PATENT AND TRADEMARK OFFICE
CERTIFICATE OF CORRECTION

| | | |
|---|---|---|
| PATENT NO. | : 11,393,663 B2 | |
| APPLICATION NO. | : 16/405244 | |
| DATED | : July 19, 2022 | |
| INVENTOR(S) | : Funk et al. | |

It is certified that error appears in the above-identified patent and that said Letters Patent is hereby corrected as shown below:

In the Claims

In Column 20, Claim 23, Line 25, insert --the-- after "of".

Signed and Sealed this
First Day of August, 2023

*Katherine Kelly Vidal*

Katherine Kelly Vidal
*Director of the United States Patent and Trademark Office*